United States Patent
Alexeev et al.

(10) Patent No.: US 12,298,508 B2
(45) Date of Patent: May 13, 2025

(54) IMAGING WAVEGUIDE

(71) Applicant: Snap Inc., Santa Monica, CA (US)

(72) Inventors: Arseny Alexeev, Abingdon (GB); Cheng Shi, Oxford (GB); Christian William Olavi Sol, London (GB); Parashara Panduranga, Banbury (GB); Venkata Karthik Nagareddy, Swindon (GB)

(73) Assignee: Snap Inc., Santa Monica, CA (US)

( * ) Notice: Subject to any disclaimer, the term of this patent is extended or adjusted under 35 U.S.C. 154(b) by 521 days.

(21) Appl. No.: 17/718,059

(22) Filed: Apr. 11, 2022

(65) Prior Publication Data

US 2022/0334396 A1    Oct. 20, 2022

Related U.S. Application Data

(60) Provisional application No. 63/174,385, filed on Apr. 13, 2021, provisional application No. 63/174,000, filed on Apr. 12, 2021.

(51) Int. Cl.
  *G02B 27/01*  (2006.01)
  *G02B 6/28*   (2006.01)

(52) U.S. Cl.
  CPC ....... *G02B 27/0172* (2013.01); *G02B 6/2817* (2013.01); *G02B 2027/0138* (2013.01); *G02B 2027/0178* (2013.01)

(58) Field of Classification Search
  None
  See application file for complete search history.

(56) References Cited

U.S. PATENT DOCUMENTS

2013/0051730 A1    2/2013  Travers et al.
2013/0107366 A1    5/2013  Clarke

FOREIGN PATENT DOCUMENTS

CN    117120772    11/2023
WO    2020065380    4/2020
(Continued)

OTHER PUBLICATIONS

"International Application Serial No. PCT/US2022/024266, International Search Report mailed Jul. 1, 2022", 4 pgs.
(Continued)

*Primary Examiner* — Bao-Luan Q Le
*Assistant Examiner* — Danell L Owens
(74) *Attorney, Agent, or Firm* — Schwegman Lundberg & Woessner, P.A.

(57) ABSTRACT

An optical waveguide combiner includes an optical waveguide substrate and an optical input region. The optical input region includes an optical input diffractive grating integrated in, or disposed on, the optical waveguide substrate. An optical output region includes an optical output diffractive grating integrated in, or disposed on, the optical waveguide substrate, At least one non-diffractive region includes at least one optical non-diffractive array of nanostructures, wherein said at least one optical non-diffractive array of nanostructures is integrated in, or disposed on, the object side of said optical waveguide substrate and at least partially surrounds at least said optical output grating; wherein the external visible reflectance of said at least one non-diffractive array of nanostructures is substantially equal to the external visible reflectance of said optical output grating.

30 Claims, 9 Drawing Sheets

(56) References Cited

FOREIGN PATENT DOCUMENTS

| WO | 2020185954 | 9/2020 |
| WO | 2022221196 | 10/2022 |

OTHER PUBLICATIONS

"International Application Serial No. PCT/US2022/024266, Written Opinion mailed Jul. 1, 2022", 6 pgs.

"International Application Serial No. PCT/US2022/024266, International Preliminary Report on Patentability mailed Oct. 26, 2023", 8 pgs.

IMAGING WAVEGUIDE

RELATED APPLICATION DATA

This application claims the benefit of priority to U.S. Provisional Patent Application Ser. No. 63/174,000, filed on Apr. 12, 2021, and U.S. Provisional Patent Application Ser. No. 63/174,385, filed on Apr. 13, 2021, the contents of which are incorporated herein as if explicitly set forth.

TECHNICAL FIELD

The present application relates to imaging waveguides and, more particularly but not exclusively, to imaging optical waveguide combiners including diffractive grating regions for augmented reality devices or mixed reality devices.

BACKGROUND

Imaging waveguides for augmented reality devices, such as near eye based augmented reality (AR) devices, and mixed reality (MR) devices, such as mixed reality smart glass applications, have been in development for at least two decades, with continued improvements occurring over that time. Many improvements have focused on enhancing functionality both in terms of optical performance as well as comfort for the wearer. Significant effort has been put into reducing the form factor of near eye devices such that they become more similar in appearance to regular ophthalmic spectacles while at the same time being made lighter and thus easier to use for extended periods of time.

BRIEF DESCRIPTION OF THE DRAWINGS

In order that the present technology may be more readily understood, reference will now be made to the accompanying drawings, in which.

Figure 1:
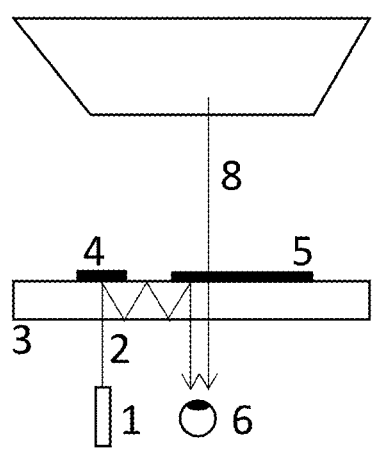
FIG. 1 shows a cross-sectional view of a typical waveguide device of the prior art when the projector module is turned on i.e., the projector module projects image bearing light.

The drawings referred to in this description should be understood as not being drawn to scale, except if specifically noted, in order to show more clearly the details of the present disclosure. Same reference numbers in the drawings indicate like elements throughout the several views. Other features and advantages of the present disclosure will be apparent from accompanying drawings and from the detailed description that follows.

DETAILED DESCRIPTION

In the following description, for purposes of explanation and not limitation, specific details are set forth, such as particular embodiments, procedures, techniques, etc. in order to provide a thorough understanding of the present disclosure. However, it will be apparent to one skilled in the art that the present disclosure may be practiced in other embodiments that depart from these specific details.

One aspect of waveguide design that has received less attention is related to the visible appearance of the diffractive elements that form the active image bearing regions of the waveguides to an onlooker. The present disclosure describes structures and features that improve the aesthetic appearance of waveguides used for AR or MR smart glasses to an onlooker and for other types of AR and MR devices such as head up display systems in automobiles or other vehicles.

The improved uniformity of the visible reflectance of the surface of the waveguide combiner camouflages the presence of diffractive surface relief grating regions to an onlooker.

The object side of the optical waveguide combiner is defined herein to mean the same side of the combiner as a real world object that can be viewed through the optical combiner by a user of the optical waveguide combiner. The eye side of the optical waveguide combiner is defined herein to mean the same side of the combiner as the eyebox of the combiner.

FIG. 1 illustrates the working principle of an Augmented Reality (AR) or Mixed Reality (MR) see-trough display. Projected images are first generated by a projector module 1. The resulting image bearing light 2 is coupled into the transparent waveguide substrate 3 via an input region 4, then totally internally reflected within said waveguide substrate and finally coupled out of said waveguide substrate via an output region 5 towards the user's eye 6. At the same time, the user perceives their surroundings 7 via the related set of light rays 8 that are transmitted through the transparent waveguide substrate 3 towards the user's eye 6.

Figure 2:
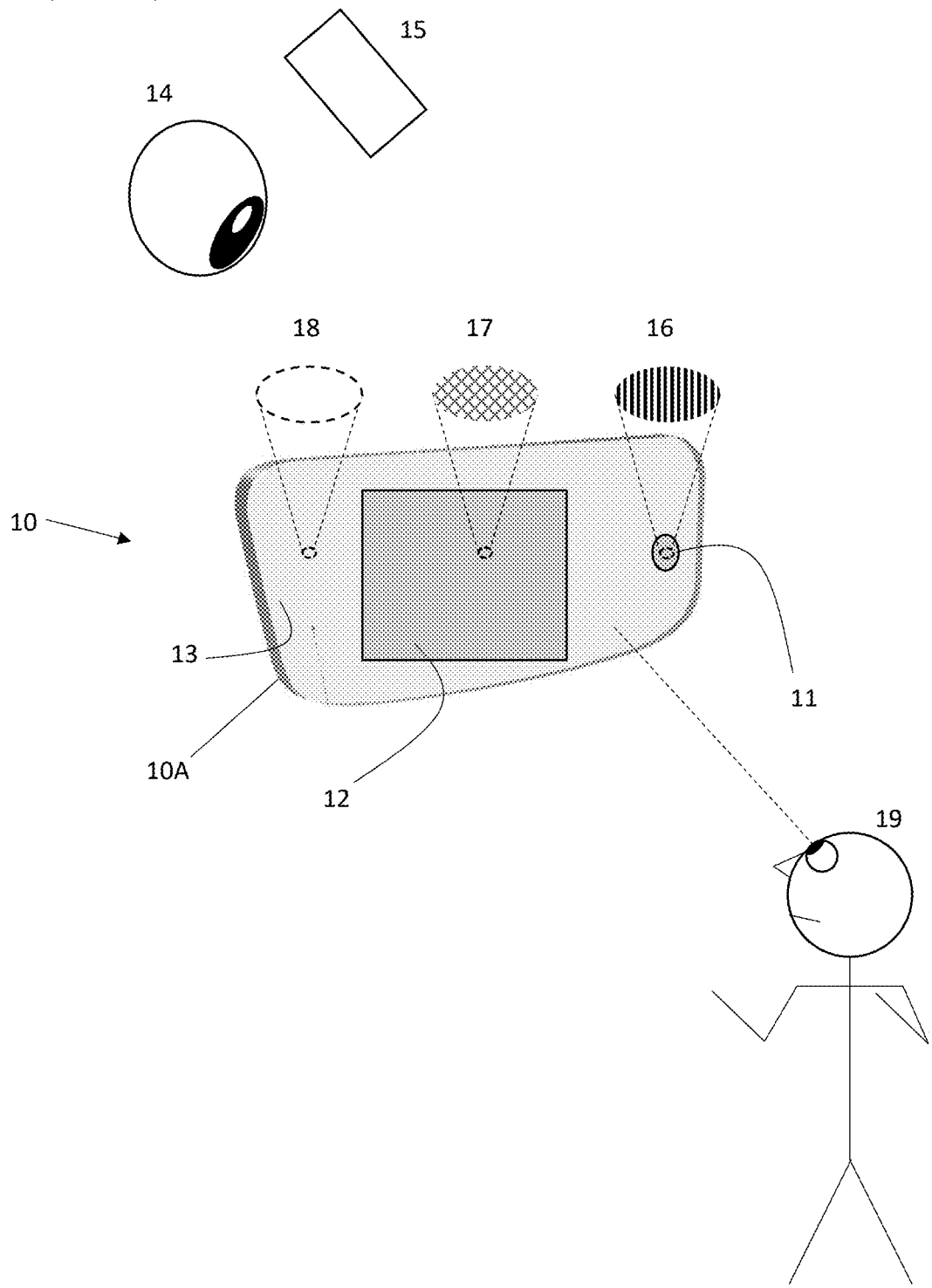
FIG. 2 depicts a perspective view of a waveguide device of the prior art as viewed by an onlooker when the projector module is turned off

FIG. 2 depicts a perspective view of a prior art waveguide combiner 10 for augmented reality (AR) or mixed reality (MR) display of information in smart glass configuration. The waveguide combiner 10 has an input region 11, an output region 12, and a region where the polymer layer 13 has a smooth surface profile. Transparent waveguide substrate 10A is formed from a planar glass sheet, which has a high degree of surface flatness and uniform thickness as well as a defined refractive index. One major surface of waveguide combiner 10 is coated with a refractive index matched polymer layer 13 and the other major surface is covered with an anti-reflective coating. Input region 11 and output region 12 are embossed into polymer layer 13 by a process of nano-imprint lithography. As such, input region 11 and output region 12 are diffractive surface relief gratings: input region 11 exhibits a linear or pseudo-linear grating (as shown in enlarged view 16 of input region 11), while output region 12 is a crossed grating (as shown in enlarged view 17 of output region 12), which is a type of two dimensional surface relief grating. Input region 11 is designed to diffract image bearing light (from projector module 15) directed toward it into waveguide combiner 10. The image bearing light coupled into transparent waveguide substrate 10A is guided by total internal reflection towards output region 12, through which a person wearing glasses, headset or other head mounted or near eye device which positions the waveguide in front of an eye 14, is able to perceive an image carried by the image bearing light. Jointly owned application US patent application publication 2020/0110261 (the contents of which are incorporated herein by reference) describes the principles of operation of such a waveguide combiner 10, to replicate a single input pupil of image bearing light that enters the input region 11 into a plurality of output pupils displayed across an enlarged eyebox region of the output region 12.

Any portion of polymer layer 13 that is not imprinted with surface relief grating structures has a smooth surface profile (as shown in the enlarged view 18 that exemplifies the absence of structures and thus the smooth surface profile). The region where the polymer layer 13 has a smooth surface profile occupies the major surface of the waveguide combiner 10 that is not patterned with input region 11 and output region 12. When an individual i.e. an onlooker 19 on the object side of the optical combiner/device as opposed to the eye side of user of the device, approaches someone that is wearing a head mounted device which includes at least one waveguide combiner 10, when the projector module 15 is turned off, the presence of output region 12, in particular, is apparent due to the difference in visible reflectance of the surface regions on waveguide combiner 10.

Figure 3:
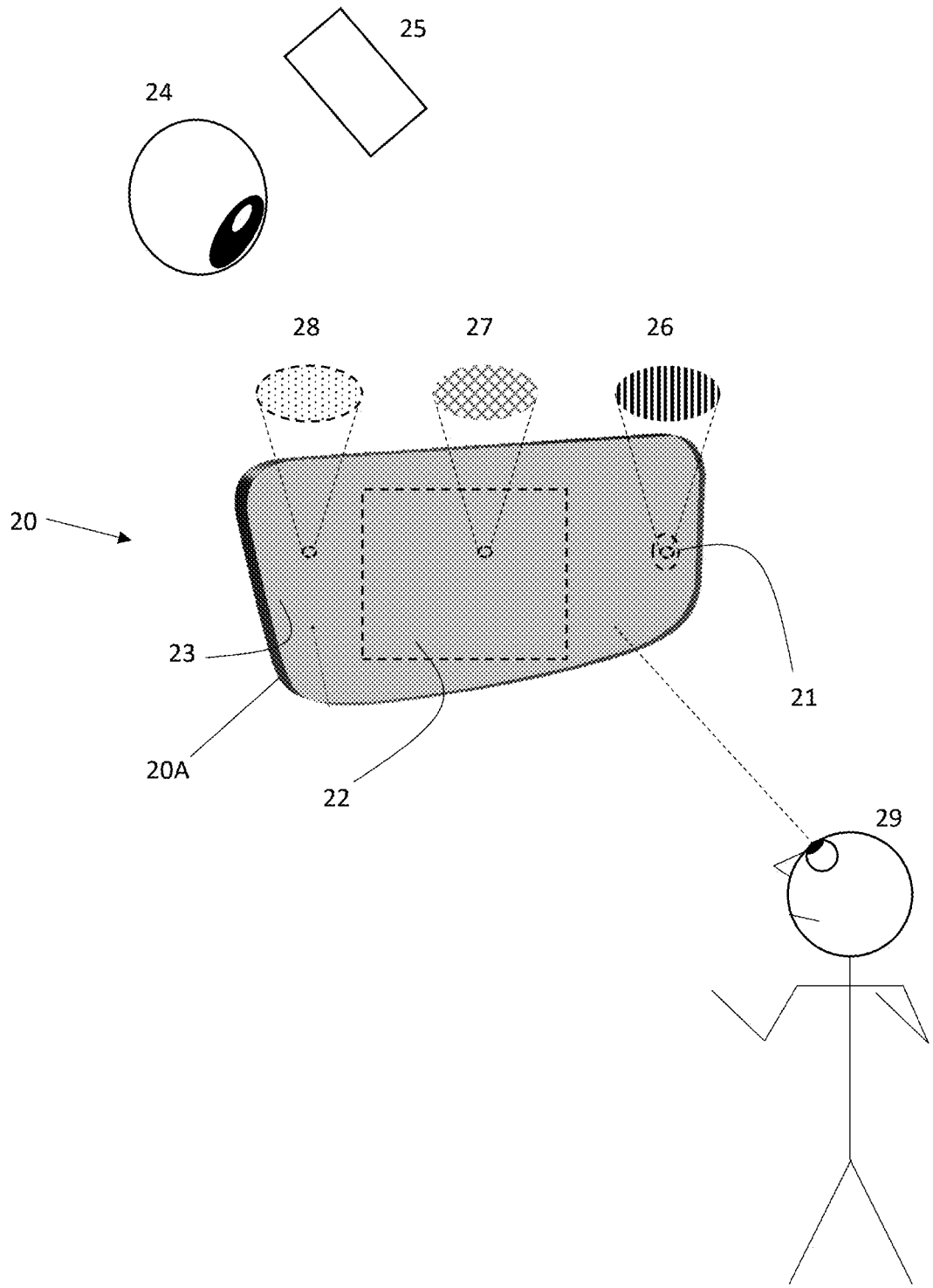
FIG. 3 depicts a perspective view of a waveguide device according to some embodiments as viewed by an onlooker when the projector module is turned off.
Figure 7:
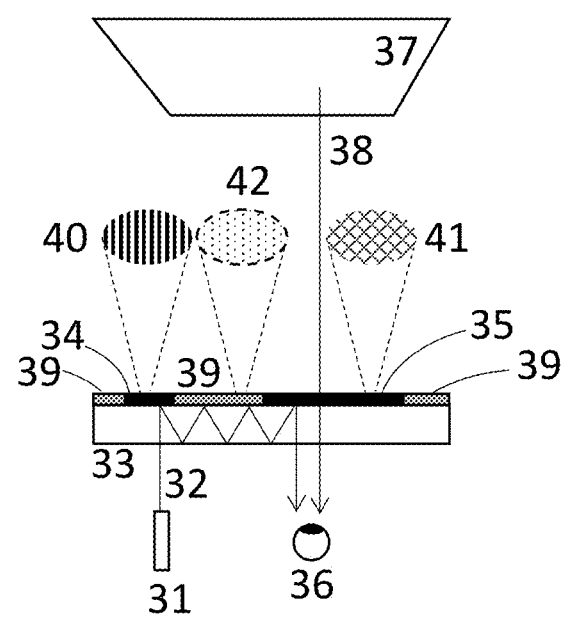
FIG. 7 shows a cross-sectional view of a waveguide device according to some embodiments when the projector module is turned on i.e., the projector module projects image bearing light.

FIG. 3 depicts a perspective view of a waveguide combiner 20 according to some embodiments. The waveguide combiner 20 has an optical waveguide substrate 20A, an optical input region 21, optical output region 22 (positions of which are identified by the dashed outlines) and a region where the polymer layer 23 is imprinted with a non-diffractive array of nanostructures (as shown in the enlarged view 28) that modulate the surface reflectance of waveguide combiner 20 (when the projector module 25 is turned off), and have no impact or substantially no impact on image bearing light undergoing total internal reflection within transparent waveguide substrate 20A (when the projector module is turned on, as shown in FIG. 7). The total internal reflection within the optical waveguide substrate 20A of the image bearing light that can propagate from the optical input region 21 to the optical output region 22 is in this way substantially unaffected by the non-diffractive array of nanostructures (as shown in enlarged view 28). The non-diffractive array of nanostructures have dimensions smaller than the wavelengths of image-bearing light undergoing total internal reflection within transparent waveguide substrate 20A such that they do not diffract such image bearing light.

In some embodiments, the non-diffractive array of nanostructures is considered to have substantially no impact on the total internal reflection of the image-bearing light from the projector module when the non-diffractive array of nanostructures causes at most 2% of any wavelength of the image-bearing light being diffracted into a diffractive order.

This region imprinted with a non-diffractive array of nanostructures occupies the major surface of the transparent waveguide substrate not occupied by the input region 21 and output region 22. Input region 21 is a linear or pseudo-linear diffractive grating (as shown in enlarged view 26 of input region 21), while output region 22 is a crossed diffractive grating (as shown in enlarged view 27 of output region 22). In some embodiments, the input grating is a crossed grating and the output grating is a linear or pseudo linear grating. In some embodiments, the input grating is a crossed grating and the output grating is a crossed grating. In some embodiments, the input grating is a linear or pseudo linear grating and the output grating is linear or pseudo linear grating. As with FIG. 2, image bearing light is directed at input region 21, which diffracts that light into the transparent waveguide substrate 20A and directs it towards output region 22, which replicates the input pupil across an enlarged eyebox region present on output region 22, through which a wearer perceives the image present in the input pupil.

Polymer layer 23 that is not imprinted with input region 21 or output region 22 is, unlike the prior art device described with respect to FIG. 2, imprinted with an array of nanostructures that are sized, shaped and spaced such that said array is non-diffractive and thus have no impact or substantially no impact on image bearing light undergoing total internal reflection within the transparent waveguide substrate 20A (when the projector module is turned on, as shown in FIG. 7). The presence of such non-diffractive array of nanostructures across the surface of waveguide 20 on the object side serves to modify or modulate the visible reflectance of the surface, such that the appearance of waveguide combiner 20 to an onlooker 29, unlike the prior art device depicted in FIG. 2, is uniformly reflective when the projector module 25 (close to the user's eye 24) is turned off. In FIG. 3, the input region 21, the output region 22 and the region imprinted with the non-diffractive array of nanostructures exhibit a similar surface reflectivity on the non-eye side. As such, the diffractive regions, i.e., input region 21 and output region 22, are made less apparent to an onlooker. In some embodiments, polymer layer 23 may be replaced by an optical coating such as titanium dioxide or silicon nitride, which is patterned to define the input region 21, output region 22 as well as the areas that are non-diffractive; and in other embodiments, polymer layer 23 is absent and the glass surface of the waveguide is directly structured or patterned with diffractive gratings and a non-diffractive array of nanostructures. Chemical or wet etching through a protecting mask created by a suitable lithographic technique may be used to define the nanostructures in either the optical coating or the glass surface respectively. Alternatively, electron beam or other etching techniques may also be used.

In some other embodiments, any one or combination of the optical input region, optical output region and the non-diffractive region(s) are integrated with or disposed on the optical waveguide substrates by other means.

Once nanostructures have been defined, either by nano-imprinting of a polymer layer or through etching of the surface, a further conformal optical coating may be applied over the entire surface of waveguide combiner 20 that has been patterned with nanostructures.

Figure 4:
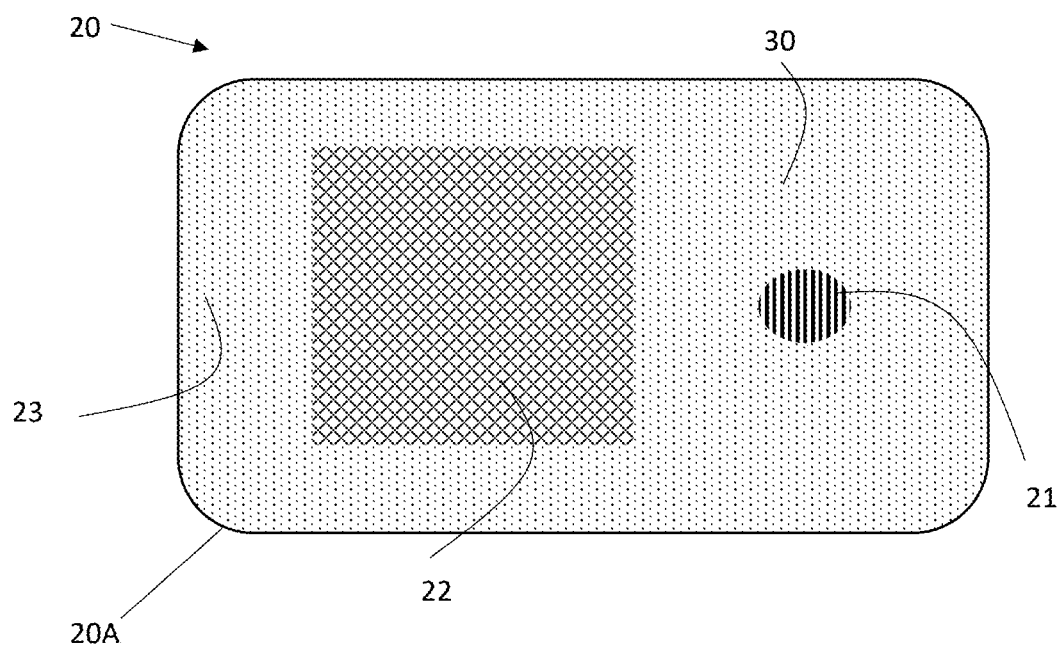
FIG. 4 depicts an exemplary plan view from above of a waveguide device, such as the waveguide device of FIG. 3, according to some embodiments indicating different regions of the waveguide.

FIG. 4 shows a plan view from above of the waveguide combiner 20 depicted in FIG. 3; depicting details of the respective patterned nanostructures. Input region 21 is provided as a linear or pseudo linear diffractive grating which is generally configured to diffract image bearing light directed orthogonal to the surface of input region 21, into transparent waveguide substrate 20A and turn the light towards output region 22.

However, in some instances the image bearing light may be introduced at angles other than 90 degrees to the surface, according to the specific design of the system. Output region 22 comprises a photonic crystal or crossed diffractive grating structure, that is configured to replicate an input pupil of image bearing light in two dimensions across the area of the output region and turn the replicated pupils toward the eye of a person looking through waveguide combiner 20, such that they perceive the information conveyed by the image bearing light, while also viewing the real-world through the waveguide. Any remaining surface of waveguide combiner 20 not patterned with diffractive structures is patterned with an array of unit cell 30 nanostructures (See FIGS. 4 and 5) having dimensions sufficiently small so as not to diffract image bearing light being propagated by total internal reflection within the transparent waveguide substrate. The visible reflectance of the non-diffractive array of unit cell 30 nanostructures, which is also referred to as a non-diffractive array of nanostructures or a non-diffractive array of repeating unit nanostructures herein, may be modulated through specific design changes, including modulating the pitch, profile shape and dimensions of such structures; provided that the dimensions remain sufficiently small so as not to impact or to substantially not impact image bearing light directed into the transparent waveguide substrate 20A via input region 21. In some embodiments, if the non-diffractive array of unit cell 30 nanostructures causes at most 2% of any wavelength of image bearing light to be diffracted into a diffractive order, it is considered that the non-diffractive array of unit cell 30 nanostructures has substantially no impact on the total internal reflection of the image-bearing light stemming from the projector module. It is thus possible to modulate the design characteristics of the unit cell 30 nanostructures to ensure surface reflectance closely matches that of the diffractive structures present in input region 21 and output region 22.

In some embodiments, each of the arrays of repeating unit nanostructures has an outer edge dimension of at least 50 nm, at least 75 nm, at least 100 nm, at least 125 nm, at least 150 nm, at least 175 nm, at least 200 nm. In other embodiments, each of the arrays of repeating unit nanostructures has an inner feature having a dimension of at least 15 nm, at least 25 nm, at least 50 nm, at least 75 nm, at least 100 nm. In further embodiments, each of the arrays of repeating unit nanostructures has an inner feature having a depth of at least 15 nm, at least 25 nm, at least 50 nm, at least 75 nm, at least 100 nm. In still further embodiments, each of the arrays of repeating unit nanostructures has exemplary outer edge dimensions of 100 nm; and exemplary inner features having a cross sectional dimension of 58 nm and a depth of 55 nm.

The presence of such non-diffracting array of unit cell 30 nanostructures is sufficient to alter the reflectance of the surface of the waveguide combiner 20 on which input region 21 and output region 22 are present so as to have said reflectance uniform across the surface of the waveguide combiner on the object side thereof. As such, the non-diffractive array of unit cell 30 nanostructures is intended to mask or camouflage the existence of the diffractive gratings, by mimicking the surface reflectance characteristics of the diffractive gratings (when the projector module 25 is turned off). In this way, the uniform reflectance provided through the non-diffractive array of unit cell 30 nanostructures obfuscates the presence of the surface relief gratings (e.g., input region 11 and output region 12). The result of such surface modification is to reduce the otherwise obvious appearance, in particular of output region 21, to an individual (such as onlooker 29 present in FIG. 3) looking at someone wearing such improved appearance waveguide based eye wear (see user's eye 24). The input region is generally hidden from the user and the onlooker by the frame supporting the waveguide combiner. Accordingly, in some embodiments it may only be necessary to camouflage the output region. Thus, in some embodiments the visible reflectance of the non-diffractive array of nanostructures is substantially equal to the visible reflectance of only the output region 22. In other embodiments, the input region is not hidden and the non-diffractive array of nanostructures are used to camouflage both the input and output regions. In these embodiments, the visible reflectance of the non-diffractive array of nanostructures is substantially equal to the visible reflectance of the input region 21 and the visible reflectance of the output region. In some embodiments, the optical non-diffractive nanostructures fully or partially surround the optical output grating and/or the optical input grating.

Figure 5:
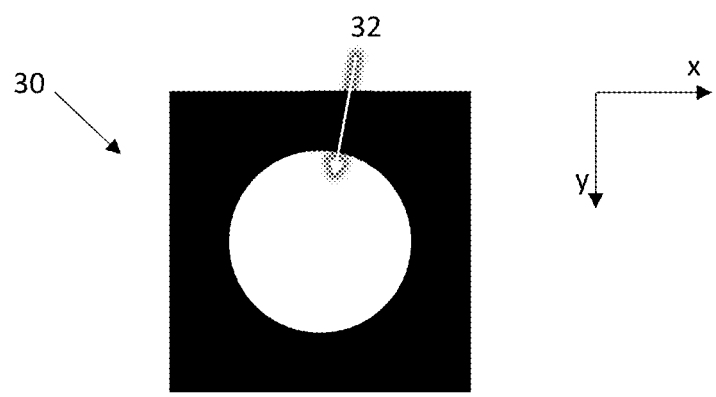
FIG. 5 represents a unit cell element of a surface pattern according to some embodiments.

FIG. 5 represents a non-diffractive unit cell element 30 according to some embodiments that may be used in any one of the embodiments of the waveguide disclosed herein. The non-diffractive unit cell element 30 is tessellated across the surface of waveguide 20, outside input region 21 and output region 22 which are both patterned with diffractive grating structures. In some embodiments, unit cell 30 comprises a central region 32 that has a depth of between 15 and 100 nm, and a cross sectional dimension of between 15 and 75 nm, while the outer region of unit cell 30 has a length in the x direction of between 25 and 200 nm and a length in the y direction of between 25 and 200 nm. In an exemplary embodiment the unit cell 30 has a length in the x direction of 100 nm, a length in the y direction of 100 nm with a central region 22 having a diameter of 58 nm and a depth of 55 nm. The central region 32 of the unit cell 30 may thus be achieved by imprinting a "hole" into polymer layer 23 or etching a hole into the glass or optical coating of waveguide 20, as depicted in FIG. 4. When viewed from above the waveguide, this "hole" may adopt a circular shape since it is the easiest shape to achieve via manufacturing processes. Alternatively, this "hole" may adopt any polygon-based shape. Central region 32 of unit cell 30 may have any pitch, shape and dimension, provided such dimension parameters are sufficiently smaller than the wavelengths of visible light to prevent any unwanted diffraction of image bearing light undergoing total internal reflection within the transparent waveguide substrate. In some embodiments, the non-diffractive array of unit cell 30 nanostructures causes at most 2% of any wavelength of the image-bearing projector module light from being diffracted into a diffractive order. As such, this is considered to represent substantially no impact, or minimal impact, on the total internal reflection of the image bearing light from the projector module. In some other embodiments, dimensions of the unit cell including the dimensions of the outer region and/or central region may differ from those specifically mentioned provided the nanostructure substantially prevents any unwanted diffraction of the image bearing light undergoing total internal reflection within the transparent waveguide substrate, while ensuring the surface visible reflectance of the waveguide combiner is similar across the entire surface.

For the array of unit cell 30 nanostructures to be non-diffractive, the pitch d between "holes" i.e., the period of the non-diffractive array of nanostructures must obey the following inequality:

$$\left| \arcsin \left( \sin (\alpha) + \frac{\lambda}{nd} \right) \right| > 90°$$

where $\alpha$ is the angle of incidence, $\lambda$ is the wavelength and n is the refractive index of the waveguide. This condition must be satisfied for all propagation angles of the image bearing light within the waveguide.

The reflectance, R, from the non-diffractive array of nanostructures can be calculated as follows, $$R = |r|^2$$

where $$r = \frac{r_{12} + r_{23}e^{-2i\delta}}{1 - r_{21}r_{23}e^{-2i\delta}}$$

where $r_{12}$, $r_{21}$, and $r_{23}$ are the Fresnel reflectance coefficients for the interfaces between the stratified layers. The Fresnel coefficients for s and p polarized light are given by, $$r_s = \frac{n_1\cos\theta_i - n_2\cos\theta_t}{n_1\cos\theta_i + n_2\cos\theta_t}$$

$$r_p = \frac{n_2\cos\theta_i - n_1\cos\theta_t}{n_1\cos\theta_t + n_2\cos\theta_i}$$

Where $n_1$ and $n_2$ are the refractive indices of the materials. The refractive index of the metamaterial corresponding to the non-diffractive array of nanostructures can be approximated by $$n_{eff} = (1-\beta)n_1 + \beta n_2$$

where $\beta$ is the filling fraction of the structure within the unit cell.

In some embodiments, when the input region 21 is much smaller than the output region 22 and the region imprinted with a non-diffractive array of unit cell 30 structures, the onlooker will not be able to see the input grating 21.

For the region imprinted with a non-diffractive array of unit cell 30 nanostructures to camouflage the output region 22, its visible external reflectance has to present an acceptable level of similarity with that of the output region. In some embodiments, the acceptable level of similarity is defined as less than 1.5% visible reflectance contrast for angles of incidence from 0 to 60 degrees.

Visible reflectance is defined as $$R_{vis} = \int \frac{R(\lambda)L(\lambda)S(\lambda)}{L(\lambda)S(\lambda)} d\lambda$$

where R is the reflectance of the surface, L is the luminous efficiency function, and S is the spectrum of illumination. In some other embodiments, the acceptable level of similarity is defined as not less than 1.5% but such that the non-diffractive structures substantially camouflage the output region 22.

The patterning of the surface of waveguide combiner 20 with input region 21, output region 22 and non-diffractive array of unit cell 30 nanostructures may be performed in a single operation using a range of techniques, including but not limited to nanoimprint lithography, reactive ion etching, electron beam etching, chemical etching, as are known in the art. In the case of nanoimprint lithography, a master imprint pattern is prepared in a stamp tool, which is imprinted into polymer layer 23 in a single step. Consequently, no misalignment of the respective patterned regions occurs. The resulting imprinted waveguide combiner 20 may thus be mass produced with a high degree of precision and uniformity between devices. Where etching processes are employed, again, the entire surface of waveguide combiner 20 may be patterned in a single operation.

Figure 6:
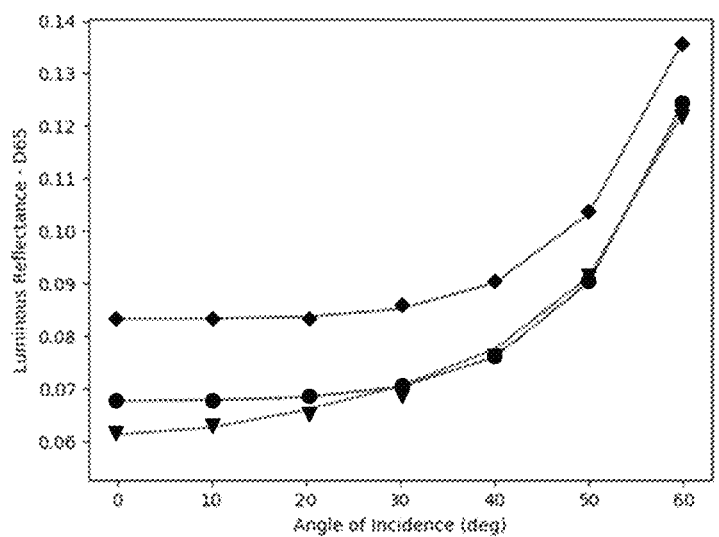
FIG. 6 depicts a plot of the luminous reflectance of the waveguide surface of FIG. 4 at different positions across the surface.

FIG. 6 depicts a graph of luminous reflectance i.e., visible reflectance of an embodiment in which a polymer layer 23 is provided on the surface of waveguide 20 versus the angle of incidence of external illuminating light (that is to say non image bearing light specifically directed into input region 21) falling on the external surface, that which is away from the eye of someone looking through the waveguide i.e. the user's eye (See user's eye 24 in FIG. 3). FIG. 6 shows the visible reflectance of a non-imprinted polymer layer 23 (diamonds), output region 22 (triangles) and unit cell 30 (circles) imprinted surface regions of waveguide 20. By multiplying the visible reflectance values of the curves of FIG. 6 by 100, we are able to get their corresponding percentages. Then, by subtracting the visible reflectance values (expressed in percentage) of the curves of interest, we are able to determine whether they are below or above the acceptable level of similarity. In some embodiments, the acceptable level of similarity is defined as less than 1.5% visible reflectance contrast for angles of incidence from 0 to 60 degrees.

The non-imprinted polymer layer 23 (diamonds) shows the highest luminous reflectance at all angles of incidence; whereas (after imprinting diffractive surface relief gratings in the input region 21 and output region 22 as well as non-diffractive surface relief gratings outside the input region 21 and output region 22) the region of waveguide 20 imprinted with unit cell 30 (circles) show excellent agreement with the luminous reflectance of output region 22 (triangles) i.e. their difference in visible reflectance is less than 1.5%; thus indicating that for all angles of incidence output region 22 (triangles) has a similar luminous reflectance to the surrounding regions that have been imprinted with non-diffracting unit cells 30 (circles). The presence of non-diffracting unit cells 30 (circles) thus transforms the reflective appearance of waveguide 20, causing output region 22 (triangles) to become less visible to an onlooker 29 (as indicated by FIG. 3), thereby improving the aesthetic appearance of smart glasses provided with such improved waveguides when the projector module 25 is turned off, without compromising functional performance with respect to presenting information contained in image bearing light that is introduced into waveguide 20 when the projector module 25 is turned on.

FIG. 7 illustrates how the image bearing light 32 from projector 31 propagates within a waveguide of some embodiments. The major surface of the transparent waveguide substrate 33 supports an input region 34, an output region 35 and a region 39 imprinted with a non-diffractive array of unit cell 30 nanostructures as shown in the enlarged view 42 of region 39 (which occupies the major surface of the transparent waveguide substrate 33 except for the input region 34 and output region 35). The input region 34 is imprinted with a linear or pseudo-linear diffractive grating as depicted in the enlarged view 40 of input region 34; while output region 35 is imprinted with a diffractive crossed grating as shown in the enlarged view 41 of output region 35.

The image bearing light 32 generated by a projector module 31 is coupled into the transparent waveguide substrate 33 via an input region 34, then totally internally reflected within said waveguide substrate and finally coupled out of said waveguide substrate via an output region 35 towards the user's eye 36. At the same time, the user perceives their surroundings 37 via the related set of light rays 38 that are transmitted through the transparent waveguide substrate 33 towards the user's eye 36. The array of non-diffractive unit cell 30 structures imprinted in region 39 has substantially no impact on the image bearing light undergoing total internal reflection within the transparent waveguide substrate 33.

Figure 8:
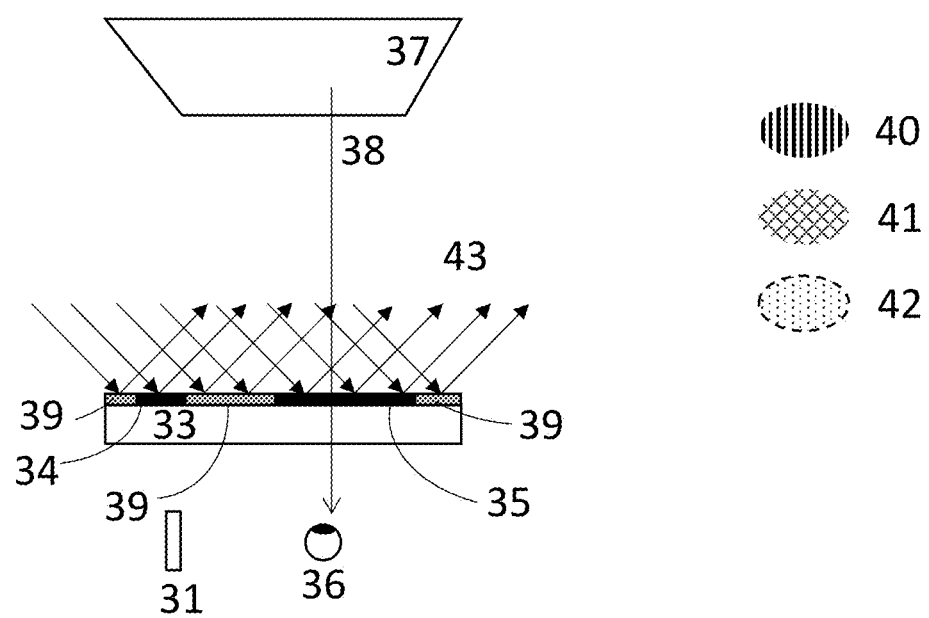
FIG. 8 shows a cross-sectional view of a waveguide device according to some embodiments when the projector module is turned off i.e., the projector module does not project image bearing light.

In FIG. 8, which illustrates the optical waveguide combiner of FIG. 7 with the projector off, there is no image bearing light from projector. The major surface of the transparent waveguide substrate 33 comprises an input region 34, an output region 35 and a region 39 imprinted with a non-diffractive array of unit cell 30 nanostructures as shown in the enlarged view 42 of region 39 (which occupies the major surface of the transparent waveguide substrate 33 except for the input region 34 and output region 35). The input region 34 is imprinted with a linear or pseudo-linear diffractive grating as depicted in the enlarged view 40 of input region 34; while output region 35 is imprinted with a diffractive crossed grating as shown in the enlarged view 41 of output region 35.

The user perceives their surroundings 37 via the related set of light rays 38 that are transmitted through the transparent waveguide substrate 33 towards the user's eye 36. The region 39 exhibits a visible reflectance similar to the output region 35 such that the former camouflages the latter: (See element 43 that represents a set of identical rays from the user's surroundings reflecting on the input region 34, output region 35 and region 39 in a same manner so as to have a similar visible reflectance for the onlooker which is not shown in FIG. 8).

In other embodiments, the optical combiner of any of the embodiments described herein before can include one or more second non-diffractive arrays of nanostructures configured to have a visible reflectance different from, or compared to, that of the output region and the other non-diffractive array of nanostructures. The second non-diffractive array(s) of nanostructures represent a pre-defined pattern, such as but not limited to a logo or trademark, viewable on the object side of the optical waveguide combiner. In some embodiments, second non-diffractive array(s) of nanostructures are configured such that the visible reflectance contrast between the one or more second non-diffractive array of nanostructures and the other non-diffractive array of nanostructures exceeds 1.5% visible reflectance contrast.

Figure 9:
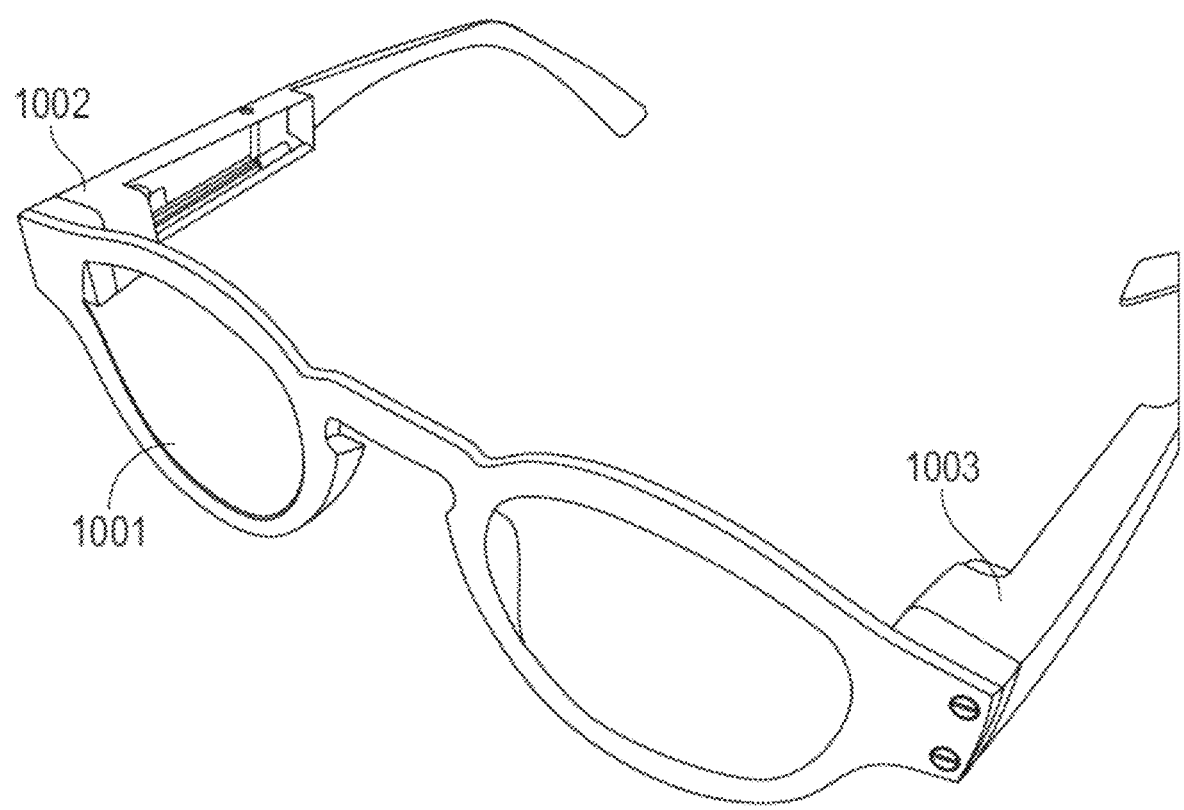
FIG. 9 illustrates an optical waveguide combiner implemented in eyeglasses according to one aspect.

According to some aspects, there is provided a near eye optical display system. The near eye optical display system may include any one of the optical waveguide combiners of the embodiments described herein. In some respects, any one of the optical waveguide combiners of the embodiments described herein may be implemented in a near-eye optical display system having an eyeglass form factor. In some embodiments, the near-eye optical display system has a light engine (projector or other light engine), a battery and an optical waveguide combiner of any one of the embodiments described herein. The near-eye optical display system may be an AR or MR optical display system. By way of example, as illustrated in FIG. 9, the near-eye optical display system has a light projector 1002, an optical waveguide combiner 1001 (which may be an optical waveguide combiner according to any one of the embodiments disclosed herein) and a battery 1003. The light projector 1002, is optically coupled to the optical waveguide combiner and electrically coupled to the battery 1003. The light projector, optical waveguide combiner and battery are carried on a frame of the eyeglasses and arranged for example as shown in FIG. 9.

The description of the present technology has been presented for purposes of illustration and description, but is not intended to be exhaustive or limited to the present technology in the form disclosed. Many modifications and variations will be apparent to those of ordinary skill in the art without departing from the scope and spirit of the present technology. Exemplary embodiments were chosen and described in order to best explain the principles of the present technology and its practical application, and to enable others of ordinary skill in the art to understand the present technology for various embodiments with various modifications as are suited to the particular use contemplated.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form.

The terminology used herein is for the purpose of describing particular embodiments only and is not intended to be limiting of further embodiments of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

If any disclosures are incorporated herein by reference and such incorporated disclosures conflict in part and/or in whole with the present disclosure, then to the extent of conflict, and/or broader disclosure, and/or broader definition of terms, the present disclosure controls. If such incorporated disclosures conflict in part and/or in whole with one another, then to the extent of conflict, the later-dated disclosure controls.

The terminology used herein can imply direct or indirect, full or partial, temporary or permanent, immediate or delayed, synchronous or asynchronous, action or inaction. For example, when an element is referred to as being "on," "connected" or "coupled" to another element, then the element can be directly on, connected or coupled to the other element and/or intervening elements may be present, including indirect and/or direct variants. In contrast, when an element is referred to as being "directly connected" or "directly coupled" to another element, there are no intervening elements present. The description herein is illustrative and not restrictive. Many variations of the technology will become apparent to those of skill in the art upon review of this disclosure.

It will be appreciated that various of the above-disclosed and other features and functions, or alternatives thereof, may be desirably combined into many other different systems or applications such as head up type displays. Various presently unforeseen or unanticipated alternatives, modifications, variations, or improvements therein may be subsequently made by those skilled in the art which are also intended to be encompassed by the following claims. For example, the head mounted display sets may be glasses, visors, goggles or headband structures and are not limited to the particular types shown in the Figures. Likewise, the shape of the optical combiner substrates may be any shape that is capable of guiding and combining images in the manner described hereinbefore.

The description of the present disclosure has been presented for purposes of illustration and description, but is not intended to be exhaustive or limited to the present disclosure in the form disclosed. Many modifications and variations will be apparent to those of ordinary skill in the art without departing from the scope and spirit of the present disclosure. Exemplary embodiments were chosen and described in order to best explain the principles of the present disclosure and its practical application, and to enable others of ordinary skill in the art to understand the present disclosure for various embodiments with various modifications as are suited to the particular use contemplated.

While various embodiments have been described above, it should be understood that they have been presented by way of example only, and not limitation. The descriptions are not intended to limit the scope of the technology to the particular forms set forth herein. Thus, the breadth and scope of a preferred embodiment should not be limited by any of the above-described exemplary embodiments. It should be understood that the above description is illustrative and not restrictive. To the contrary, the present descriptions are intended to cover such alternatives, modifications, and equivalents as may be included within the spirit and scope of the technology as defined by the appended claims and otherwise appreciated by one of ordinary skill in the art. The scope of the technology should, therefore, be determined not with reference to the above description, but instead should be determined with reference to the appended claims along with their full scope of equivalents.

What is claimed is:

1. An optical waveguide combiner, comprising;
an optical waveguide substrate;
an optical input region, wherein said optical input region comprises an optical input diffractive grating integrated in, or disposed on, said optical waveguide substrate;
an optical output region, wherein said optical output region comprises an optical output diffractive grating integrated in, or disposed on, said optical waveguide substrate; and
at least one non-diffractive region, wherein said at least one non-diffractive region comprises at least one optical non-diffractive array of nanostructures, wherein said at least one optical non-diffractive array of nanostructures is integrated in, or disposed on, an object side of said optical waveguide substrate and at least partially surrounds at least said optical output diffractive grating, wherein an external visible reflectance of said at least one optical non-diffractive array of nanostructures is substantially equal to an external visible reflectance of said optical output diffractive grating.

2. The optical waveguide combiner of claim 1, wherein total internal reflection within the optical waveguide substrate of image bearing light that can propagate from said optical input region to said optical output region is substantially unaffected by said at least one optical non-diffractive array of nanostructures.

3. The optical waveguide combiner of claim 1, wherein a refractive index of the at least one optical non-diffractive array of nanostructures is substantially matched to a refractive index of the optical waveguide substrate.

4. The optical waveguide combiner of claim 1, wherein said at least one optical non-diffractive array of nanostructures fully surround said optical output diffractive grating and/or said optical input diffractive grating; and wherein the external visible reflectance of said at least one optical non-diffractive array of nanostructures is substantially equal to the external visible reflectance of the at least said optical output diffractive grating and/or an external visible reflectance of said optical input diffractive grating.

5. The optical waveguide combiner of any claim 1, wherein said optical waveguide substrate includes a first side and a second side opposing said first side; wherein, when in use, said first side is an eye side of the optical waveguide combiner and said second side is the object side of the optical waveguide combiner, and wherein a coating is applied to said second side of the optical waveguide substrate,
wherein said at least one optical input region comprises a linear surface relief grating patterned in said coating;
wherein said at least one optical output region comprises a surface relief grating patterned in said coating; and
wherein said non-diffractive region comprises additional regions of said coating patterned with said at least one non-diffractive array of nanostructures and surrounds said optical input region and/or said optical output region.

6. The optical waveguide combiner of claim 5, wherein said coating has substantially a same refractive index as the waveguide substrate.

7. An imaging waveguide for an augmented reality (AR) or mixed reality (MR) device, comprising;
a waveguide having a first major surface and a second major surface, and an anti-reflective coating applied over the first major surface of the waveguide; and
a coating applied on the second major surface of the waveguide, wherein the coating has substantially a same refractive index as the waveguide and comprises a first region patterned with a linear surface relief grating and a second region patterned with a two dimensional surface relief grating;
wherein the coating further comprises additional regions patterned with non-diffractive arrays of nanostructures disposed across the surface of the waveguide surrounding the first and second regions, wherein the additional regions are configured to exhibit substantially a same external visible reflectance as that of the regions patterned with diffractive surface relief gratings while having minimal impact on total internal reflection of image bearing light introduced via the first linear surface relief grating, and directed out of the waveguide via the two dimensional surface relief grating.

8. The waveguide of claim 7, wherein the additional regions patterned with non-diffractive arrays of nanostructures comprise a non-diffractive array of unit nanostructures.

9. The waveguide of claim 8, wherein each of the non-diffractive arrays of unit nanostructures has an outer edge dimension of at least 50 nm, at least 75 nm, at least 100 nm, at least 125 nm, at least 150 nm, at least 175 nm, at least 200 nm.

10. The waveguide of claim 8, wherein each of the non-diffractive arrays of unit nanostructures has an inner feature diameter of at least 15 nm, at least 25 nm, at least 50 nm, at least 75 nm, at least 100 nm.

11. The waveguide of claim 8, wherein each of the non-diffractive arrays of nanostructures has an inner feature with a depth of at least 15 nm, at least 25 nm, at least 50 nm, at least 75 nm, at least 100 nm.

12. The waveguide of claim 8, wherein each of the non-diffractive arrays of unit nanostructure has an exemplary outer edge dimension of 100 nm; with an inner feature having a cross sectional dimension of 58 nm and a depth of 55 nm.

13. The waveguide of claim 8, wherein the coating has a refractive index that is different compared to the refractive index of the waveguide.

14. The waveguide of claim 8 further comprising at least one second non-diffractive array of nanostructures having a visible reflectance different from that of the additional regions patterned with non-diffractive arrays of nanostructures; said at least one second non-diffractive array of nanostructures defining a pre-defined pattern viewable on an object side of the waveguide.

15. The waveguide of claim 14, wherein a visible reflectance contrast between said at least one second non-diffractive array of nanostructures and the additional regions patterned with non-diffractive array of nanostructures exceeds 1.5% visible reflectance contrast.

16. A method of modifying a visible reflectance of a surface of an imaging waveguide to obfuscate the presence of surface relief gratings on the surface, comprising;
providing a waveguide having a first major surface and a second major surface,
patterning a linear surface relief grating in a first region of the first major surface;
patterning a two dimensional surface relief grating in a second region of the first major surface; and
patterning a further structure that is a non-diffractive array of nanostructures across regions of the first major surface not patterned with linear or two dimensional surface relief gratings;
wherein the further structure that is a non-diffractive array of nanostructures is configured to exhibit substantially a same visible reflectance as that of the linear surface relief grating or the two dimensional surface relief grating such that an appearance of the surface relief gratings on the first major surface is obfuscated.

17. The method of claim 16, wherein the further structure comprises a non-diffractive array of repeating unit nanostructures.

18. The method of claim 17, wherein each of the repeating unit nanostructures has an outer edge dimension of at least 50 nm, at least 75 nm, at least 100 nm, at least 125 nm, at least 150 nm, at least 175 nm, at least 200 nm.

19. The method of claim 17, wherein each of the repeating unit nanostructures has an inner feature having a dimension of at least 15 nm, at least 25 nm, at least 50 nm, at least 75 nm, at least 100 nm.

20. The method of claim 17, wherein each of the repeating unit nanostructures has an inner feature having a depth of at least 15 nm, at least 25 nm, at least 50 nm, at least 75 nm, at least 100 nm.

21. The method of claim 17, wherein each of the repeating unit nanostructures has exemplary outer edge dimensions of 100 nm and exemplary inner features having a cross sectional dimension of 58 nm and a depth of 55 nm.

22. The method of claim 16, wherein the operations of patterning comprise one of patterning a coating applied to the first major surface of the waveguide surface or directly etching the first major surface of the waveguide to define nanostructure features.

23. An optical display system comprising:
a light engine; and
a waveguide including:
optical waveguide substrate;
an optical input region, wherein the optical input region comprises an optical input diffractive grating integrated in, or disposed on, the optical waveguide substrate;
an optical output region, wherein the optical output region comprises an optical output diffractive grating integrated in, or disposed on, the optical waveguide substrate; and
at least one non-diffractive region including at least one optical non-diffractive array of nanostructures, wherein the at least one optical non-diffractive array of nanostructures is integrated in, or disposed on, an object side of the optical waveguide substrate and at least partially surrounds at least the optical output diffractive grating, wherein an external visible reflectance of the at least one non-diffractive array of nanostructures is substantially equal to the external visible reflectance of the optical output grating.

24. The optical display system of claim 23, wherein the optical display system comprises a near eye optical display system.

25. The optical display system of claim 24, wherein the near eye optical display system comprises an augmented reality display system.

26. The optical display system of claim 24, wherein the near eye optical display system comprises a mixed reality display system.

27. The optical display system of claim 23, wherein the light engine and waveguide are carried on an eyeglass frame.

28. The optical display system of claim 23, wherein the optical display system comprises a head up display system.

29. A method of modifying a visible reflectance of a surface of an optical waveguide combiner to obfuscate the presence of surface relief gratings on the surface, the method comprising:
providing an optical waveguide combiner comprising an optical waveguide substrate, an optical input region and an optical output region, wherein said optical input region comprises an optical input diffractive grating integrated in, or disposed on, said optical waveguide substrate; and wherein said optical output region comprises an optical output diffractive grating integrated in, or disposed on, said optical waveguide substrate; and
forming at least one non-diffractive region including:
disposing or integrating at least one optical non-diffractive array of nanostructures on an object side of said optical waveguide substrate and at least partially surrounding at least said optical output grating, wherein an external visible reflectance of said at least one optical non-diffractive array of nanostructures is substantially equal to an external visible reflectance of said optical output grating on an object side of the said optical waveguide combiner.

30. The method of claim 29, wherein total internal reflection within the optical waveguide substrate of image bearing light that can propagate from said optical input region to said optical output region is substantially unaffected by said optical non-diffractive array of nanostructures.

* * * * *